Jan. 28, 1964 J. L. COMER 3,119,431

TOOL FOR BENDING LEADS EXTENDING FROM ELECTRICAL COMPONENTS

Filed Jan. 12, 1962 2 Sheets-Sheet 1

INVENTOR

Jerry L. Comer

BY R. P. Miller

ATTORNEY

TOOL FOR BENDING LEADS EXTENDING FROM ELECTRICAL COMPONENTS

Filed Jan. 12, 1962 2 Sheets-Sheet 2

INVENTOR
Jerry L. Comer,
BY R. P. Miller
ATTORNEY

United States Patent Office 3,119,431

Patented Jan. 28, 1964

3,119,431

TOOL FOR BENDING LEADS EXTENDING FROM ELECTRICAL COMPONENTS

Jerry L. Comer, Mebane, N.C., assignor to Western Electric Company, Incorporated, New York, N.Y., a corporation of New York Filed Jan. 12, 1962, Ser. No. 166,467
6 Claims. (Cl. 153—11)

This invention relates to a tool for bending leads extending from electrical components and more particularly to a device which centers a component intermediate two bending elements and spaces the bending elements a distance apart equal to the distance between a pair of selectively chosen apertures in a mounting board.

In the assembly of electrical components to a mounting board, it is necessary to bend the leads of the components while centering the component between the bends, and then inserting the leads in the apertures in the mounting board. At present, the distance between a pair of apertures is manually gaged and accordingly transferred to the component leads. The leads are then bent with a pair of pliers while trying to center the component intermediate the bends. This procedure is slow, inaccurate, and expensive. In order to alleviate these difficulties, it is necessary that a simple tool be provided that, while directly gaging the leads for bending, centers the component intermediate the bends.

It is an object of the present invention to provide a new and simple tool for bending leads extending from electrical components.

It is a further object of the present invention to provide a tool that gages the leads of a component for bending, while centering the component intermediate the bends.

Another object of the present invention is to provide a tool that spaces a pair of bending elements relative to a pair of feelers that are inserted in apertures in a mounting board while positioning the feelers and bending elements in parallelism.

Another object of the invention resides in facilities which impart motion applied to either of two bending elements or feelers to the remaining bending elements or feelers while maintaining the bending elements and feelers in parallelism.

A further object of the invention resides in the use of a structure which centers a component intermediate two bending elements while positioning the component leads with respect to a pair of bending elements.

With these and other objects in view, the present invention contemplates a tool having a pair of crossed members pivotally mounted to a plate which may be manipulated to position feelers and bending elements. The pair of feelers is pivotally secured to the lower ends of the members and the pair of bending elements is pivotally secured to the opposite ends of the members. The feelers may be selectively positioned within mounting apertures formed in a circuit board so that the bending elements are positioned to bend the leads to fit within the apertures. Suitable linkages are provided for maintaining the feelers and bending elements in parallelism. The tool further provides a centering apparatus which centers a component intermediate the bending elements while positioning the component leads with the tops of the bending elements.

Other objects and advantages of the present invention will be apparent from the following detailed description when considered in conjunction with the accompanying drawings, wherein.

Figures 1, 2, 3:
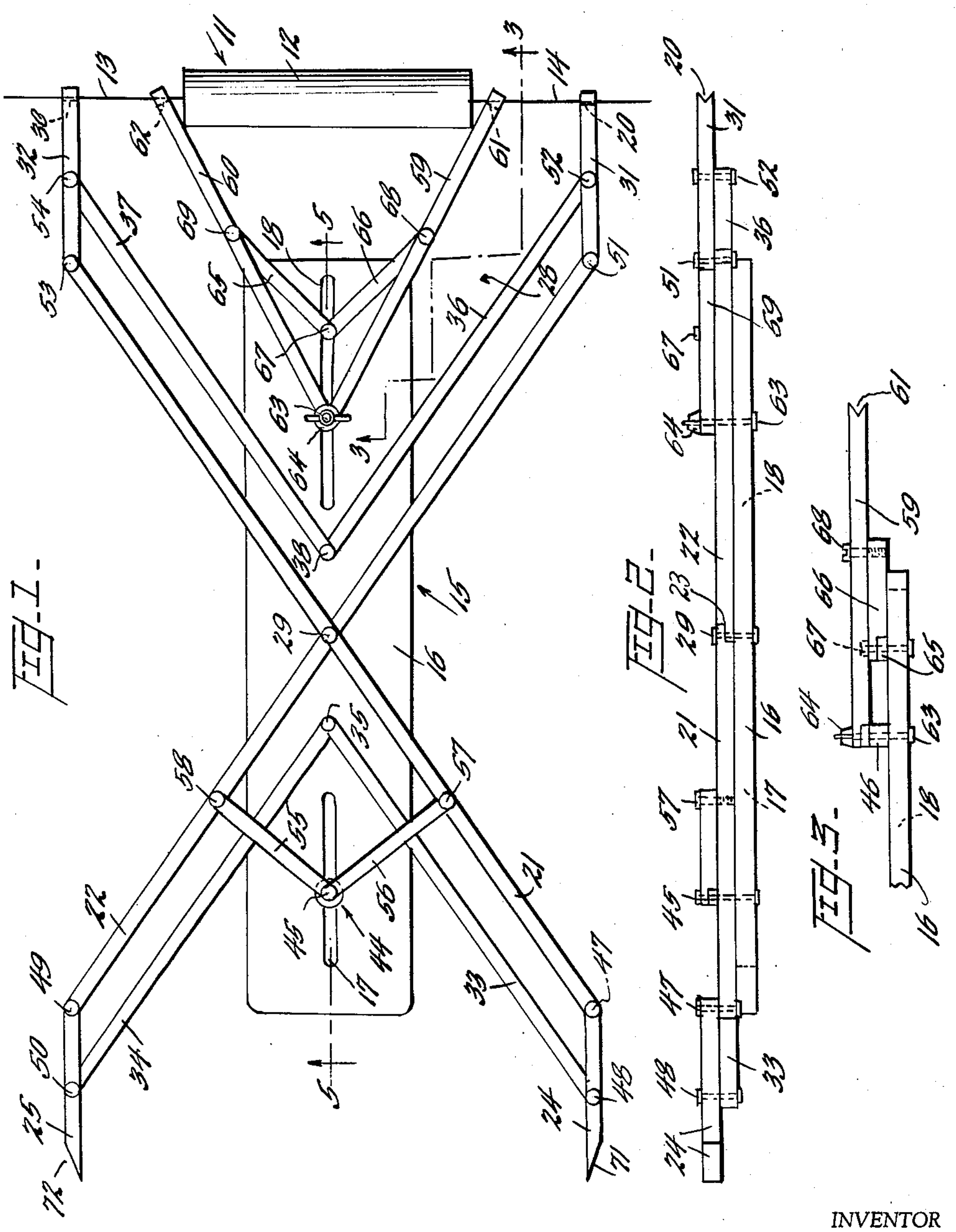
FIG. 1 is a front view of a bending tool and centering device constructed in accordance with the principles of the present invention.
FIG. 2 is a side view of the bending tool shown in FIG. 1.
FIG. 3 is a side view of the centering device taken along line 3—3 of FIG. 1.

Referring first to FIG. 1, there is shown an electrical component 11 having a cylindrical body portion 12 with leads 13 and 14 extending from either side. In general, the electrical component 11 is set in the bending tool generally designated as 15, while a pair of feelers 24 and 25 are inserted in apertures 26 formed in a mounting board 27 shown in FIG. 4. A centering device designated generally as 28 is then utilized to center the component 11 intermediate a pair of bending elements 31 and 32 and the leads 13 and 14 are accordingly given a right angle bend.

Referring to FIGS. 1 and 2, there is shown a plate 16. A pair of crossed members 21 and 22 are cut away at their point of intersection 23 to provide recesses to accommodate each other so that the members lie in the same plane. The crossed members are pivotally mounted on the plate 16 by a pivot pin 29. A first pair of links 33 and 34 are pivotally secured together and to the plate 16 by a pivot pin 35. The feelers 24 and 25 have tapered lower portions 71 and 72. The pair of feelers 24 and 25 are pivotally secured to the lower ends of the members 21 and 22 and links 33 and 34. The feeler 24 is pivotally secured to the ends of member 21 and link 33 by pivot pins 47 and 48. Feeler 25 is pivotally secured to the ends of member 22 and link 34 by pivot pins 49 and 50. A second pair of links 36 and 37 are pivotally secured together and to the plate 16 by pivot pin 38. A pair of bending elements 31 and 32, which have notches 20 and 30, are pivotally secured to the ends of the crossed members 21 and 22 and the second pair of links 36 and 37. Bending element 31 is secured to the upper end of member 22 and link 36 by pivot pins 51 and 52. Bending element 32 is pivotally secured to the upper ends of member 21 and link 37 by pivot pins 53 and 54.

Links 55 and 56 are pivotally connected to the crossed members 21 and 22 by threaded pivot pins 57 and 58. The links 55 and 56 are pivotally secured together and spaced from the plate 16 by a headed pivot pin 45 which extends through a washer 44 and a first elongated slot 17 in the plate. The links 55 and 56, as readily seen in the drawings, transmit motion to either member 21 or 22 to the other member. This is accomplished by allowing the pivot pin 58 to slide freely in the first slot 17.

The feelers 24 and 25 and the bending elements 31 and 32 are maintained in substantially parallel planes upon any adjustment of the crossed members 21 and 22. One structural combination of elements for accomplishing this result is embodied in the tool 15. The distance between pivot pins 35 and 29 is equal to the distance between both pivot pins 49 and 50 and pivot pins 47 and 48. Member 22, feeler 25, link 34, and the distance between pivot pins 35 and 29 form a parallelogram. When either member 21 or 22 is moved through an arc, feeler 25 will remain parallel to a fixed line represented by the distance between pivot pins 35 and 29, feeler 25 being the opposite side of the parallelogram with respect to the line drawn between pivot pins 35 and 29. In an identical manner, feeler 24 will always remain parallel to a line drawn between pivot pins 35 and 29 and thus always remain parallel to feeler 25.

In a similar manner, link 37, bending element 32, member 21, and a second fixed line drawn between pivot pins 29 and 33 will form a parallelogram. Bending element 32 will always remain parallel to the line drawn between pivot pins 29 and 33. In an identical manner, bending element 31 will always remain parallel to a line drawn between pivot pins 29 and 33, and thus the feelers 24 and 25 and the bending elements 31 and 32 are maintained in parallelism.

Referring now to FIGS. 1 and 3, a pair of centering guides 59 and 60 are shown. The ends of the centering guides 59 and 60 have notches 61 and 62, respectively, to accommodate the leads 13 and 14 of the component 11. The other ends of the guide links 59 and 60 are pivotally secured together by a threaded pivot stud 63 extending through a second aperture 18 in the plate 16. A locking device or latch 64, represented by a wing nut, is threaded onto the pivot stud 63 to selectively lock the guide links to the plate. A second pair of links 65 and 66 is pivotally connected together and spaced from the plate 16 by a headed pivot member 67 extending through a washer 46 and the second slot 18 in the plate. The opposite ends of the links 65 and 66 are pivotally secured to the guides 59 and 60 by threaded pivot pins 68 and 69. As can readily be appreciated, the links 65 and 66 position the guides 59 and 60 equidistant from the bending elements 31 and 32 as the guides are moved up and down in the second slot 18 or spread and closed about threaded pivot stud 63. The wing nut 64 serves the additional functions of providing a gripping surface by which an operator can adjust the centering links 59 and 60 and also serves as a lock when tightened against the centering links to secure them in a desired position.

Figure 4:
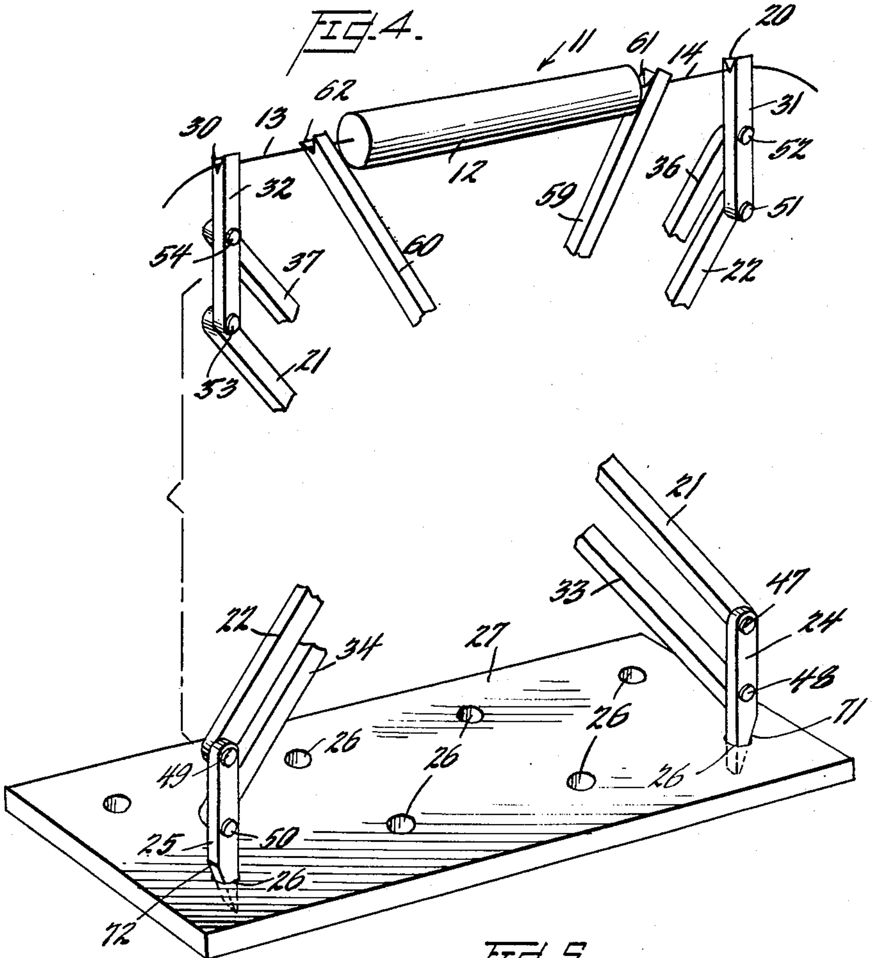
FIG. 4 is a fragmentary perspective view showing portions of the tool centering a component so that the leads may be bent to fit into apertures formed in a mounting board.
Figure 5:
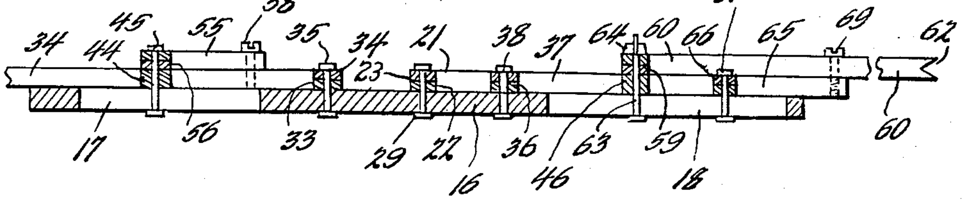
FIG. 5 is a sectional view of the centering device taken along line 5—5 of FIG. 1.

In operation, as shown in FIG. 4, the feelers 24 and 25 are first inserted in the selected pair of apertures 26 in the mounting board 27. The tapered portions 71 and 72 of the feelers 24 and 25 center the feelers in the apertures 26 and furthermore permit the tool to be used in a variety of differently-sized apertures. The component leads 13 and 14 are positioned in the notches 61 and 62 in the centering guide links 59 and 60. The guide links 59 and 60 are then moved until they contact the cylindrical body portion 12 of the component 11, thus centering the component. Wing nut 64 is gripped and moved either up or down until the leads 13 and 14 lie in the notches 20 and 30 provided in the bending elements 31 and 32. The wing nut 64 is then tightened, thus locking the centering apparatus 28 from further movement. The cylindrical component 11 is now centered and in alignment with the bending elements 31 and 32. The leads 13 and 14 are given a right angle bend by any suitable device, such as a pair of pliers. The component 11 is removed from the bending tool 15 and the bending tool is removed from the apertures 26 in the mounting board 27. The component 11 is now easily inserted into the preselected apertures 26 in the mounting board 27.

It is to be understood that the above-described arrangements of apparatus are simply illustrative of an application of the principles of the invention, and many other modifications may be made without departing from the spirit and scope of the invention.

What is claimed is:

1. In a bending tool, a plate, a pair of crossed members pivotally mounted at the point of intersection to said plate, a pair of feelers, each of which is pivotally mounted on the end of one of said members, a pair of bending elements pivotally mounted on the opposite ends of said members, and means pivotally interconnecting said feelers and bending elements and said plate for positioning the feelers and bending elements in parallelism.

2. In a tool having a pair of crossed members pivotally mounted on a plate, a pair of feelers pivotally supported on one end of said members, a pair of bending elements pivotally mounted on the opposite end of said members, a pair of guides pivotally and slidably mounted on said plate, and means interconnecting said plate and said guides for positioning the ends of said guides equidistant from said bending elements.

3. In a tool for centering a piecepart intermediate bending elements, a plate, a pair of feelers, a pair of bending elements, means mounted on said plate for supporting said feelers and said bending elements, means mounted on said plate for maintaining said feelers and bending elements in parallelism, and means mounted on said plate for centering a piecepart intermediate said bending elements.

4. In a bending tool, a plate, a pair of crossed members, a pivot pin extending through said plate and the intersection point of said members, means mounted on said plate for imparting motion of one member to the other member, a pair of feelers, each pivotally mounted to the end of one member, a pair of bending elements pivotally mounted to the opposite end of said members, and means mounted on said plate for positioning the feelers and bending elements in parallelism.

5. In a tool for centering a component with leads extending to either side intermediate a pair of bending elements, a plate, a pair of feelers, a pair of bending elements, means mounted on said plate for supporting said feelers and bending elements, a pair of guides pivotally mounted on said plate, means mounted on said plate for adjusting said guides to center the component intermediate said bending elements and position the leads in alignment with the tops of said bending elements, and a pair of links interconnecting said guides and said plate for imparting motion of one guide to the other.

6. In a tool for bending leads extending from a component in accordance with the spacing between apertures formed in a mounting board, a plate having a first slot and a second slot spaced from said first slot, a pair of crossed members pivotally mounted on said plate at their mid-points, a pair of feelers pivotally mounted on one end of said members and positionable in said spaced apertures, a pair of bending elements pivotally mounted on the opposite end of said members for supporting said leads, a first pair of links slidably and pivotally mounted in said first slot at one end and pivotally mounted on said members at their opposite end for imparting motion of one member to the other, a pair of guides slidably and pivotally mounted in said second slot for supporting said component, and a second pair of links slidably and pivotally mounted at one end in said second slot and pivotally mounted at their opposite ends to said guides for imparting motion of one guide to the other to center said component between said pair of bending elements.

References Cited in the file of this patent

UNITED STATES PATENTS

| | | |
|---|---|---|
| 2,358,142 | Carlin | Sept. 12, 1944 |
| 2,487,451 | Kurmer | Nov. 8, 1949 |
| 2,784,623 | Reynolds | Mar. 12, 1957 |
| 3,030,701 | Regennitter | Apr. 24, 1962 |